(12) United States Patent
Misaki et al.

(10) Patent No.: US 7,271,449 B2
(45) Date of Patent: Sep. 18, 2007

(54) SEMICONDUCTOR DEVICE HAVING TRIPLE-WELL STRUCTURE

(75) Inventors: Makoto Misaki, Kyoto (JP); Kazumi Kurimoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 125 days.

(21) Appl. No.: 11/119,849

(22) Filed: May 3, 2005

(65) Prior Publication Data
US 2006/0086990 A1 Apr. 27, 2006

(30) Foreign Application Priority Data
Oct. 21, 2004 (JP) .............................. 2004-307053

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ................. 257/368; 257/371; 257/E27.067
(58) Field of Classification Search ................. 257/338, 257/351, 368, 369, 371
See application file for complete search history.

(56) References Cited
U.S. PATENT DOCUMENTS
6,936,898 B2 * 8/2005 Pelham et al. .............. 257/371

FOREIGN PATENT DOCUMENTS
JP 09-055483 2/1997
JP 10-056082 2/1998

* cited by examiner

*Primary Examiner*—Hoai Pham
(74) *Attorney, Agent, or Firm*—McDermott Will & Emery LLP

(57) ABSTRACT

A semiconductor device has a semiconductor substrate of a first conductivity type, a first well region of the first conductivity type which is formed to extend from the surface of the semiconductor substrate toward the inside thereof, a pair of second well regions of a second conductivity which are formed to extend from the surface of the semiconductor substrate toward the inside thereof in such as manner as to sandwich the first well region therebetween, and a third well region of the second conductivity type which is formed under each of the first well region and the pair of second well regions in the semiconductor substrate. The third well region electrically connects the pair of second well regions to each other. The first well region has at least a portion thereof connected to the region of the semiconductor substrate in which the third well region is not formed.

14 Claims, 18 Drawing Sheets

SEMICONDUCTOR DEVICE HAVING TRIPLE-WELL STRUCTURE

BACKGROUND OF THE INVENTION

The present invention relates to a semiconductor device comprising a MIS transistor having a triple-well structure and to a fabrication method therefor. More particularly, it aims at increasing latch-up breakdown voltage.

As semiconductor devices have been increasingly miniaturized with recent advances in semiconductor fabrication technologies, the arrangement pitch of transistors has been reduced rapidly. As a result, the resistance of a well has increased prominently so that the lowering of latch-up breakdown voltage has presented a problem. Specifically, since an implantation angle (tilt angle) of about 7° is used in the ion implantation of an impurity for forming a well, an implant mask (resist) becomes a barrier in a well in the vicinity of the mask so that an amount of the implanted impurity is reduced and the impurity concentration is thereby lowered. The influence of the lowered concentration is negligible when the width of the well is large but, when the width of the well becomes smaller as a result of miniaturization, the ratio of a region in which the mask as the barrier lowers the impurity concentration to the entire well relatively increases. Consequently, the impurity concentration of the entire well prominently lowers and the well resistance increases so that the latch-up breakdown voltage lowers.

To prevent this, a so-called triple-well structure has been used in a memory such as a DRAM (dynamic random access memory), in which a P-type semiconductor substrate having a P-well region and an N-well region is provided with an N-type region having the peak of the impurity concentration thereof at a position deeper than each of the P-well region and the N-well region such that the resistance of the N-well region is reduced and the latch-up breakdown voltage is increased (see, e.g., Japanese Laid-Open Patent Publication No. HEI 9-55483).

FIG. 17 is a plan view showing an example of the layout of a conventional memory cell portion. FIG. 18 is a cross-sectional view taken along the line G-G' of FIG. 17.

FIG. 19 is a cross-sectional view taken along the line Z-Z' of FIG. 17.

As shown in FIGS. 17 to 19, a plurality of N-well regions 11 and a plurality of P-well regions 12 are formed to be alternately arranged, each extending from a surface of a P-type semiconductor substrate 10 toward the inside thereof. Between the N-well regions 11 and the P-well regions 12 in the surface portion of the P-type semiconductor substrate 10, there are provided isolations 14 having an STI (shallow trench isolation) structure, though they (isolations 104) are not shown in FIG. 17. In addition, a Deep-N-well region 13 is formed in a portion of the P-type semiconductor substrate 10 under the N-well regions 11 and the P-well regions 12 (i.e., a twin-well structure). The Deep-N-well region 13 is formed in an entire region under the twin-Well structure and at a depth which does not affect the surface concentration of the twin-well structure, thereby providing electrical connection between the individual N-well regions 11.

As also shown in FIGS. 17 to 19, an N-type MIS (metal-insulator semiconductor) transistor (e.g., NMOS (N-channel metal oxide semiconductor) transistor) 15 is formed on each of the P-well regions 12, while a P-type MIS transistor (e.g., PMOS (P-channel metal oxide semiconductor) transistor) 16 is formed on each of the N-well regions 11. Specifically, the N-type MIS transistors 15 is composed of: a gate oxide film 17 formed on each of the P-well regions 12; a gate electrode 18 formed on the gate oxide film 17; insulating sidewalls 19 formed on the side surfaces of the gate electrode 18; and N-type source/drain regions 20 formed in the surface portion of the P-well region 12. On the other hand, the P-type MIS transistor 16 is composed of: a gate oxide film 21 formed on each of the N-well regions 11; a gate electrode 22 formed on the gate oxide film 21; insulating sidewalls 23 formed on the side surfaces of the gate electrode 22; and P-type source/drain regions 24 formed in the surface portion of the N-well region 11.

For latch-up prevention in an SRAM (statistic random access memory), a method which uses an N-well/source structure, not a triple-well structure, in an SRAM memory cell and silicidizes a substrate surface is adopted in the invention disclosed in Japanese Laid-Open Patent Publication No. HEI 10-56082 to provide electrical connection between a P region and an N region and thereby reduce a contact area for a reduction in layout size.

SUMMARY OF THE INVENTION

Although the problem of the increased N-well resistance can be solved when the memory cell of a semiconductor device composed of a MIS transistor, such as an SRAM, is provided with the conventional triple-well structure, the problem of increased P-well resistance occurs because the Deep-N-well that has been formed in the entire region under the P-well isolates the P-well from the P-type substrate. To provide the P-well with a substrate potential, it becomes necessary to provide a contact area for providing the surface of the P-well with the substrate potential, which causes the problem that the area of the memory cell cannot be reduced.

In view of the foregoing, it is therefore an object of the present invention to reduce N-well resistance in a semiconductor device having a triple-well structure and thereby increase latch-up breakdown voltage, while suppressing an increase in P-well resistance.

To attain the foregoing object, the present inventors have developed the technological idea of forming a triple-well structure in such a manner as to leave a region in which a P-type substrate and a P-well are in direct contact.

Specifically, a semiconductor device according to the present invention comprises: a semiconductor substrate of a first conductivity type; a first well region of the first conductivity type which is formed to extend from a surface of the semiconductor substrate toward an inside thereof; a pair of second well regions of a second conductivity type which are formed to extend from the surface of the semiconductor substrate toward the inside thereof in such a manner as to sandwich the first well region therebetween; and a third well region of the second conductivity type which is formed under each of the first well region and the pair of second well regions in the semiconductor substrate, wherein the third well region electrically connects the pair of second well regions to each other and at least a portion of the first well region is connected to a region of the semiconductor substrate in which the third well region is not formed.

In the semiconductor device according to the present invention, the individual second well regions of the second conductivity type (e.g., N-well regions) are connected electrically to each other by the third well region of the second conductivity type (e.g., a Deep-N-well region) formed at a deeper position so that the N-well resistance is reduced advantageously. Accordingly, even when a surge current flows into, e.g., a specified one of the N-well regions, it becomes possible to prevent the localization of the surge current to the specified N-well region or to the device formed therein and thereby increase the latch-up breakdown voltage.

In the semiconductor device according to the present invention, at least a portion of the first well region of the first conductivity type (e.g., a P-well region) is electrically connected to the semiconductor substrate of the first conductivity type (e.g., a P-type substrate and, more specifically, the region of the P-type substrate in which the Deep-N-well region is not formed) in the triple-well structure without intervention of a contact. This suppresses an increase in P-well resistance. Since it is no more necessary to provide a contact area for providing the surface of the P-well with a substrate potential, the chip area can be reduced accordingly by the reduced contact area.

Since the present invention has thus provided the Deep-N-well which electrically connects the N-well regions to each other in such a manner as to leave the region in which the P-well and the P-type substrate are electrically connected to each other, the latch-up breakdown voltage can be increased by reducing the N-well resistance, while suppressing an increase in P-well resistance. The present invention has also connected to the P-well and the P-type substrate to each other so that the chip area is reduced advantageously by reducing the contact area for providing the surface of the P-well with the substrate potential.

As described above, the present invention relates to the semiconductor device comprising the MIS transistor having the triple-well structure and to the fabrication method therefor. When applied to an extremely small memory cell such as an SRAM, the present invention particularly achieves the effect of increasing the latch-up breakdown voltage by reducing the N-well resistance, while suppressing an increase in P-well resistance, and is therefore extremely useful.

In the present application, a "semiconductor substrate" may be either a substrate made of a semiconductor such as silicon or a substrate (including an insulating substrate) provided with a semiconductor region such as a silicon region.

DETAILED DESCRIPTION OF THE INVENTION

EMBODIMENT 1

Figure 1:
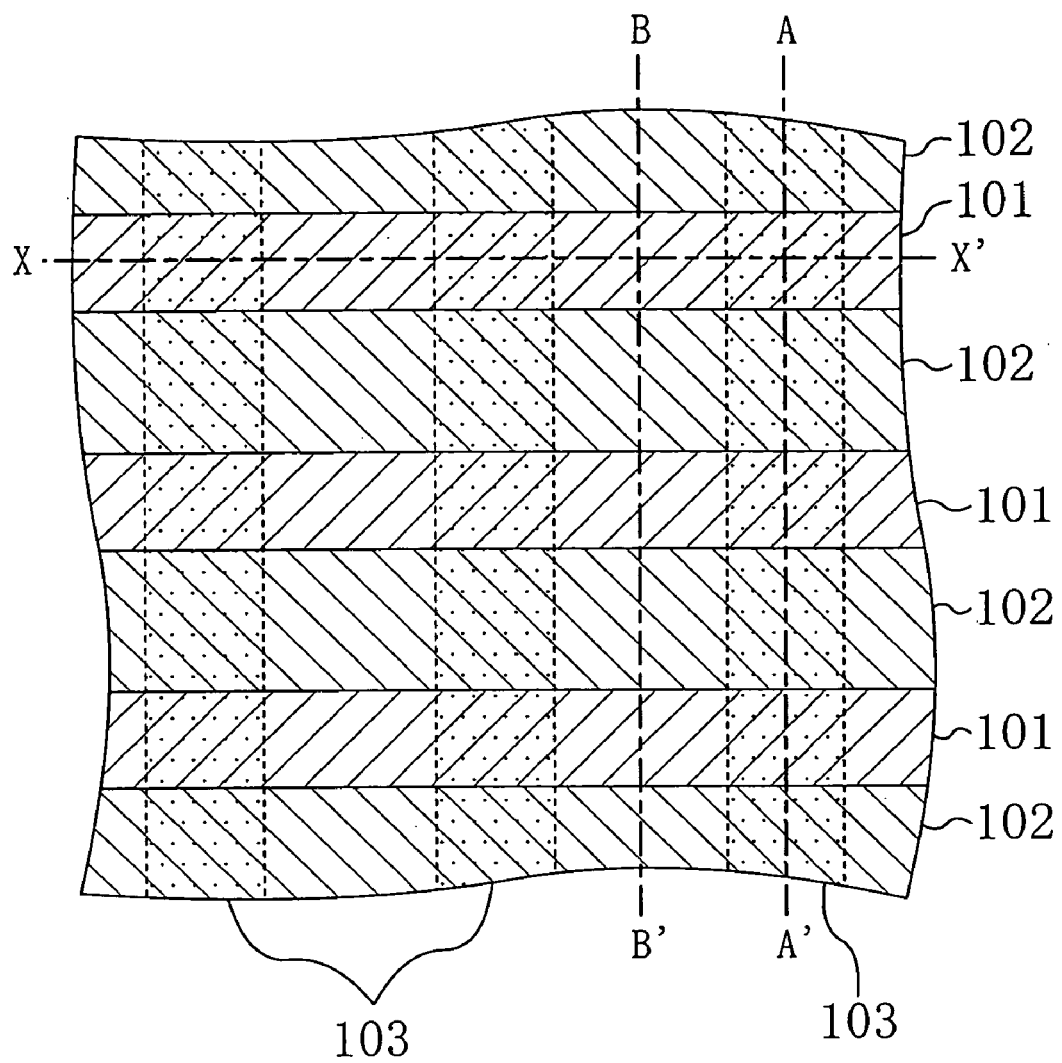
FIG. 1 is a plan view of a semiconductor device according to a first embodiment of the present invention.

Referring to the drawings, a description will be given herein below to a semiconductor device according to a first embodiment of the present invention and to a fabrication method therefor by using the memory cell portion of an SRAM composed of MIS transistors.

Figure 2:
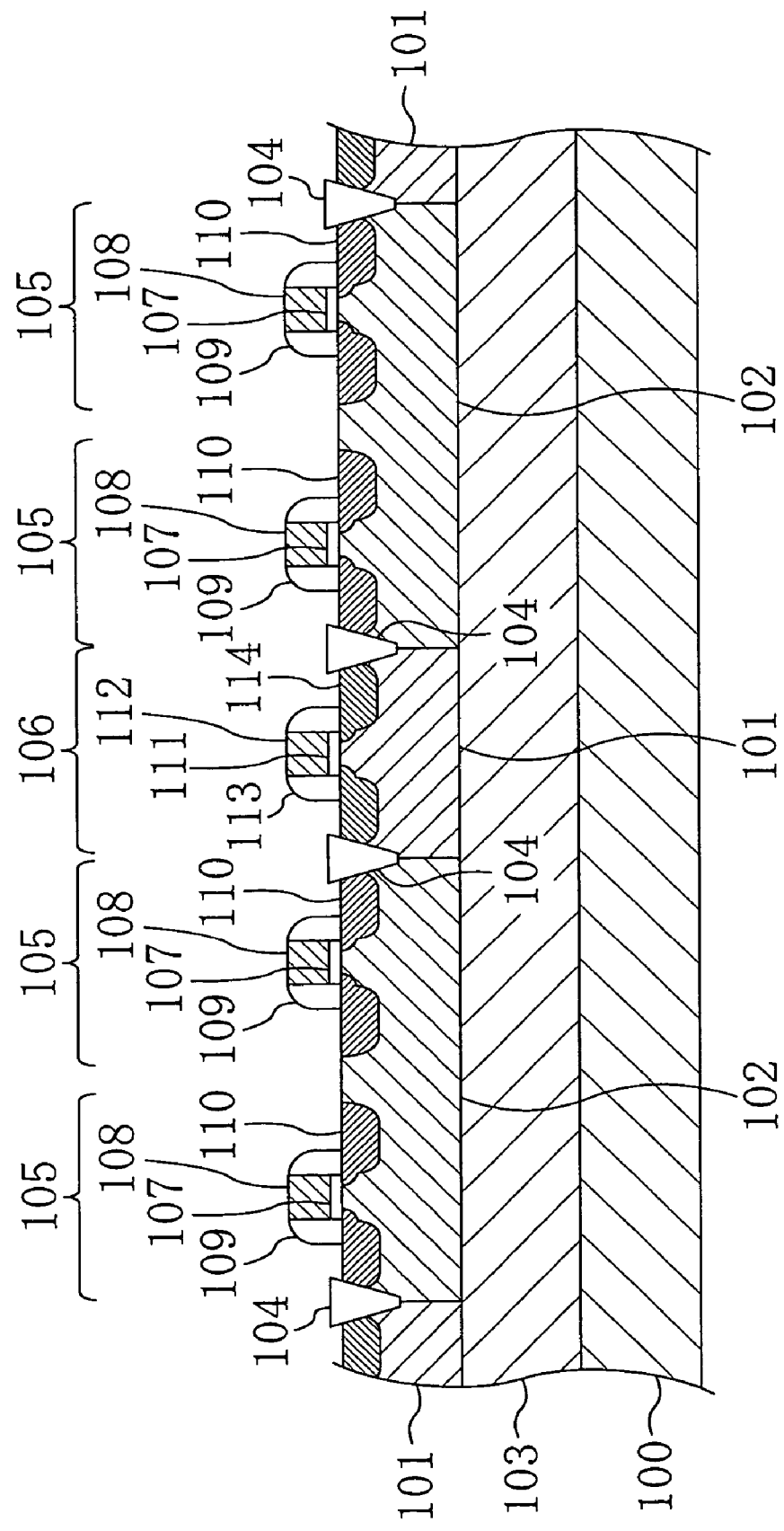
FIG. 2 is a cross-sectional view taken along the line A-A' of FIG. 1.
Figure 3:
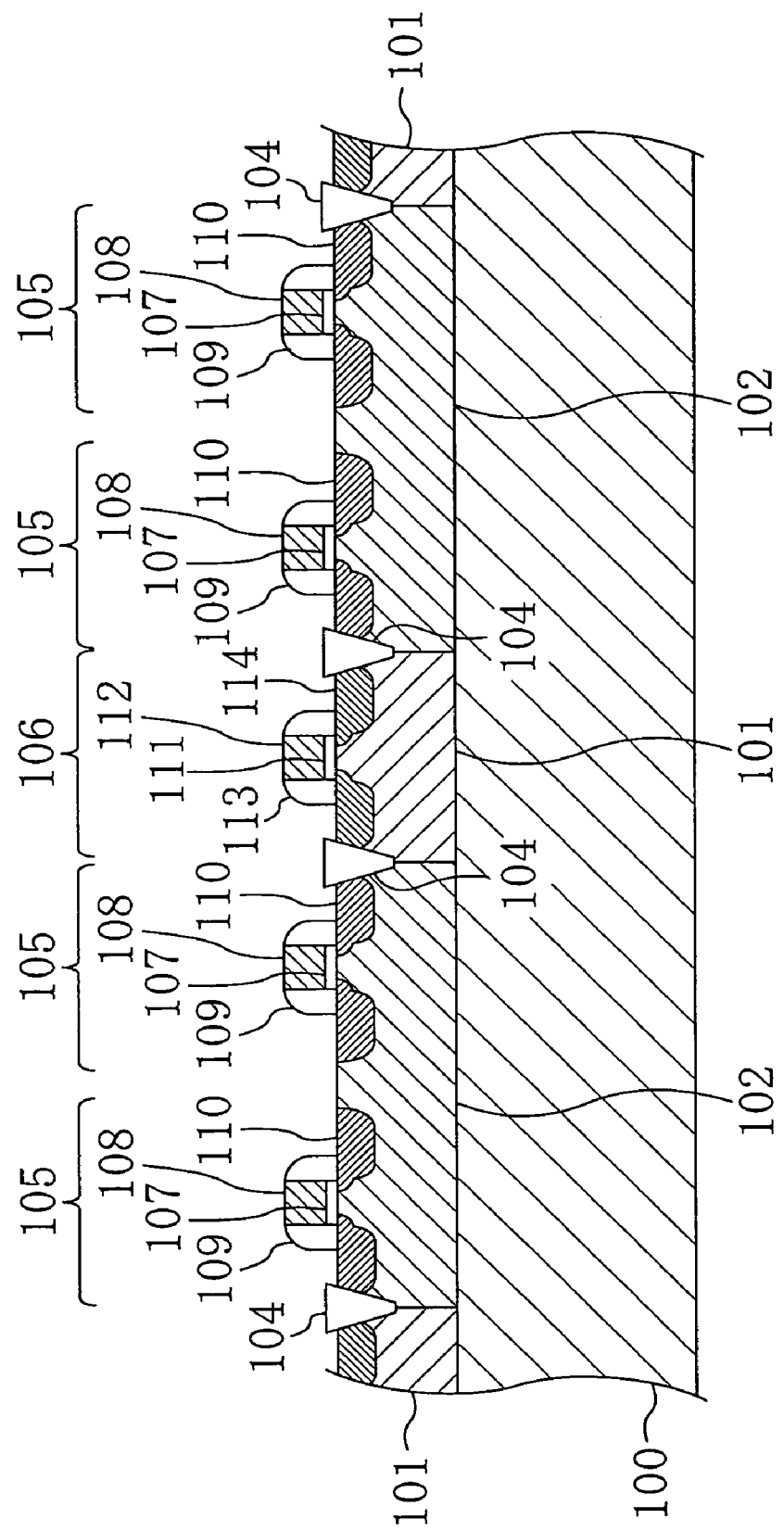
FIG. 3 is a cross-sectional view taken along the line B-B' of FIG. 1.
Figure 4:
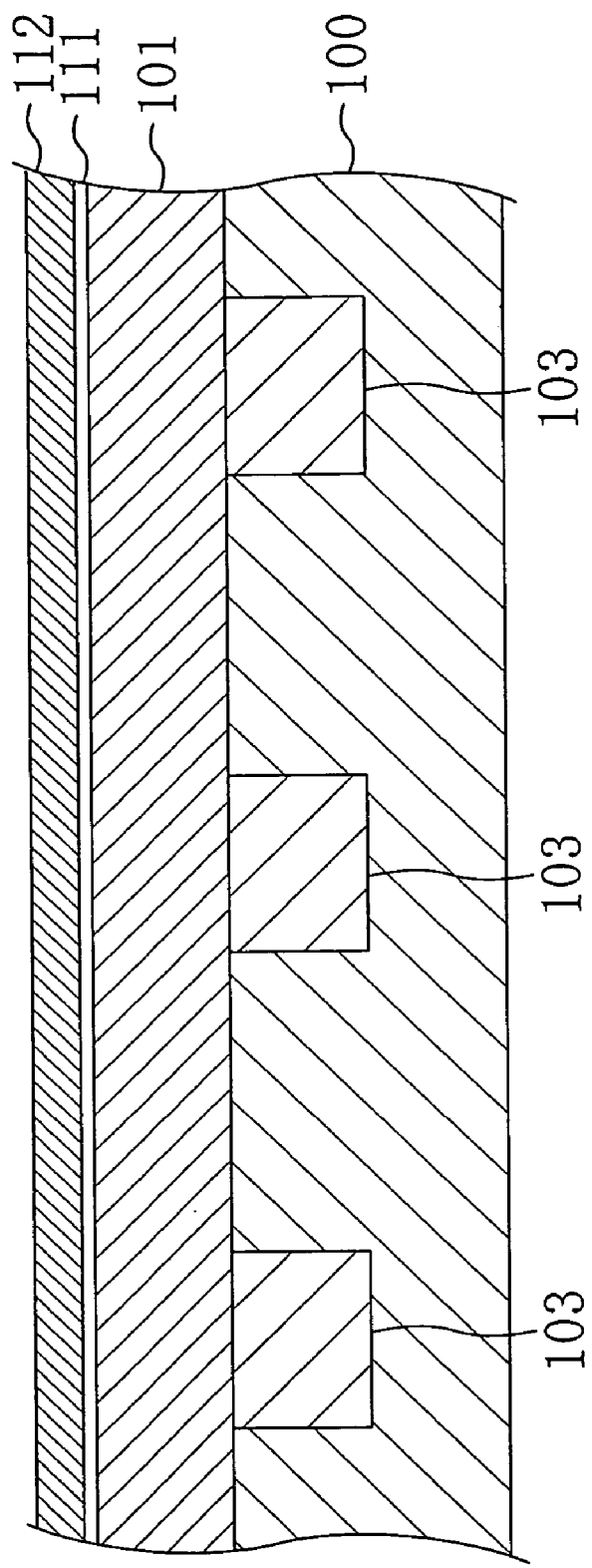
FIG. 4 is a cross-sectional view taken along the line X-X' of FIG. 1.

FIG. 1 is a plan view showing an example of the layout of the memory cell portion of the SRAM according to the present invention. FIG. 2 is a cross-sectional view taken along the line A-A' of FIG. 1. FIG. 3 is a cross-sectional view taken along the line B-B' of FIG. 1. FIG. 4 is a cross-sectional view taken along the line X-X' of FIG. 1. In FIG. 1, the depiction of transistor structures formed on individual well regions is omitted.

As shown in FIGS. 1 to 4, a plurality of N-well regions 101 and a plurality of P-well regions 102 are formed to be alternately arranged, each extending from a surface of a P-type semiconductor substrate 100 toward the inside thereof. Between the N-well regions 101 and the P-well regions 102 in the surface portion of the P-type semiconductor substrate 100, there are provided isolations 104 having an STI structure, though they (isolations 104) are not shown in FIG. 1. In addition, a plurality of Deep-N-well regions 103 are formed under the N-well regions 101 and the P-well regions 102 (i.e., a twin-well structure) of the P-type semiconductor substrate 100. The Deep-N-well regions 103 are formed to orthogonally intersect the N-well regions 101 and the P-well regions 102 at a depth which does not affect the surface concentration of the twin-well structure, thereby providing electrical connection between the individual N-well regions 101.

The electrical connection between each of the Deep-N-well regions 103 and each of the N-well regions 101 is achieved by setting the peak value of the impurity concentration of each of the Deep-N-well regions 103 and each of the N-well regions 101 at the same level. Specifically, the electrical connection is provided between each of the N-well regions 101 and each of the Deep-N-well regions 103 by performing ion implantation for forming the deep-N-well regions 103 such that the peak of the impurity concentration of each of the Deep-N-well regions 103 is formed at a position slightly deeper than the peak level in the implant profile of each of the N-well regions 101.

As also shown in FIGS. 1 to 4, an N-type MIS transistor (e.g., an NMOS transistor) 105 is formed on each of the P-well regions 102 and a P-type MIS transistor (e.g., a PMOS transistor) 106 is formed on each of the N-well regions 101. Specifically, the N-type MIS transistor 105 is composed of: a gate oxide film 107 formed on the P-well region 102; a gate electrode 108 formed on the gate oxide film 107; insulating sidewalls 109 formed on the side surfaces of the gate electrode 108; and N-type source/drain regions 110 formed in the surface portion of the P-well region 102. On the other hand, the P-type MIS transistor 106 is composed of: a gate oxide film 111 formed on the N-well region 101; a gate electrode 112 formed on the gate oxide film 111; insulating sidewalls 113 formed on the side surfaces of the gate electrode 112; and P-type source/drain regions 114 formed in the surface portion of the N-well region 101.

The triple-well structure according to the present embodiment is characterized in that, unlike the conventional triple-well structure in which the Deep-N-well region 13 is provided in the entire region under the twin-well structure composed of the N-well regions 11 and the P-well regions 12, the plurality of Deep-N-well regions 103 are provided in stripes along directions perpendicular to the respective directions in which the N-well regions 101 and the P-well regions 102 extend. Consequently, there are formed regions (which are shown in FIG. 2) having the triple-well structure in which the Deep-N-well regions 103 are formed and regions (which are shown in FIG. 3) having the twin-well structure in which the Deep-N-well regions 103 are not formed. In each of the regions having the conventionally used twin-well structure shown in FIG. 3, each of the P-well regions 102 is partly connected electrically to the P-type semiconductor substrate 100 (more precisely, the region of the P-type semiconductor substrate 100 in which the Deep-N-well region 103 is not formed). That is, since the region in which the Deep-N-well region 103 is not provided remains under each of the P-well regions 102, the connection between each of the P-well regions 102 and the P-type semiconductor substrate 100 is retained to allow the P-well region 102 and the P-type semiconductor substrate 100 to be electrically connected to each other without providing the P-well region 102 with a contact area for providing a substrate potential.

Thus, the important characteristic of the present invention is that the region in which the Deep-N-well region 103 is not provided is left under each of the P-well regions 102. The characteristic allows the triple-well structure to achieve an intrinsic effect, i.e., the effect of reducing N-well resistance and thereby increasing latch-up breakdown voltage, while suppressing an increase in P-well resistance. In addition, since the substrate potential can be shared among the individual P-well regions 102, the contact area for providing the surface of each of the P-well regions 102 with the substrate potential can be reduced so that the effect of suppressing the area occupied by an arrangement of memory cells is also achievable.

Figure 5:
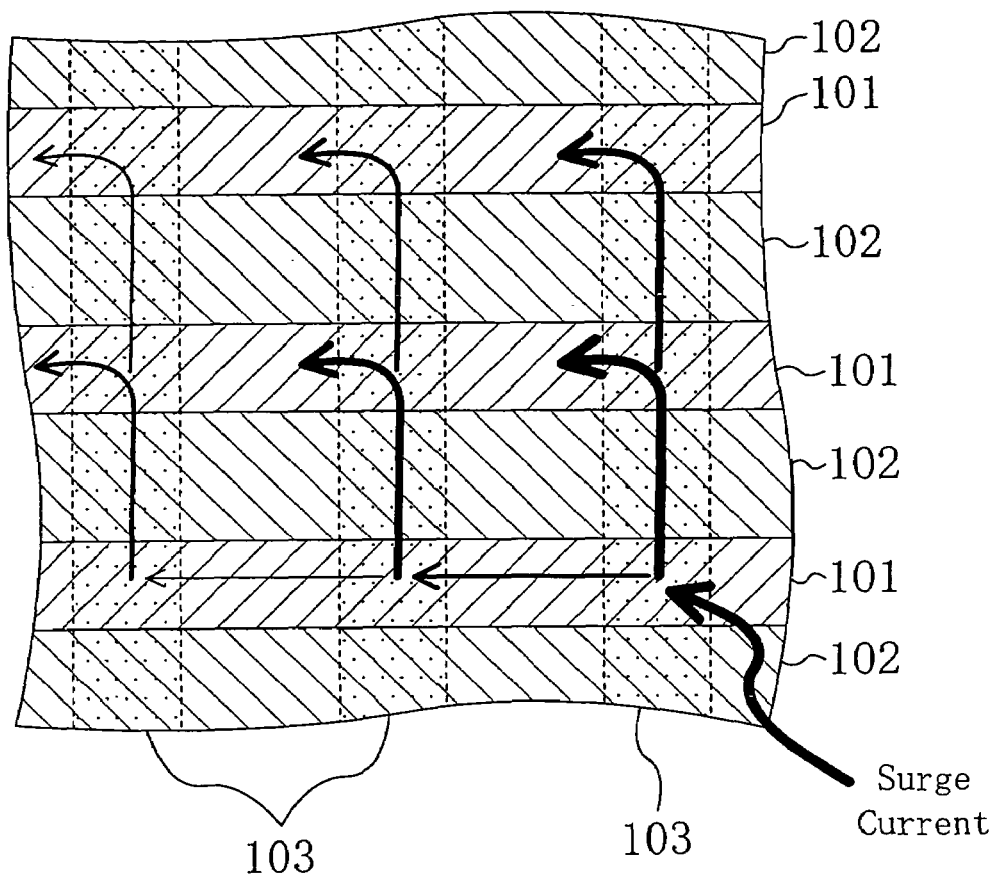
FIG. 5 is a view showing an example of the path of a surge current that has flown into the semiconductor device according to the first embodiment.

FIG. 5 shows an example of the path of a surge current that has flown into the memory cell portion of the SRAM according to the present embodiment. The description of the components shown in FIG. 5 which are the same as shown in FIG. 1 will be omitted by retaining the same reference numerals. As shown in FIG. 5, the majority of the surge current that has flown from the input/output portion (not shown) of the SRAM flows from a given one of the N-well regions 101 into the low-resistance Deep-N-well region 103 which is connected electrically to the given N-well region 101 and is then distributed from the Deep-N-well region 103 into the plurality of N-well regions 101 arranged in alternate relation with the plurality of P-well regions 102. By thus providing the path of the surge current, it becomes possible to prevent the localization of the surge current to the N-well region 101 as a portion into which the surge current has flown and to the device formed therein and thereby increase the latch-up breakdown voltage.

A description will be given herein below to a method for fabricating the semiconductor device comprising the triple-well structure according to the present embodiment shown in FIGS. 1 to 4.

Figure 6A:
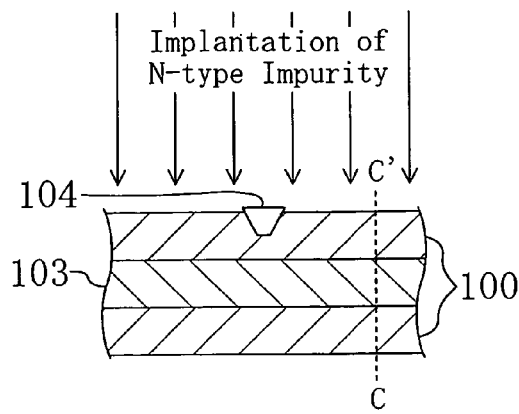
FIGS. 6A to 6F are cross-sectional views illustrating the individual process steps of a method for fabricating the semiconductor device according to the first embodiment.
Figure 6B:
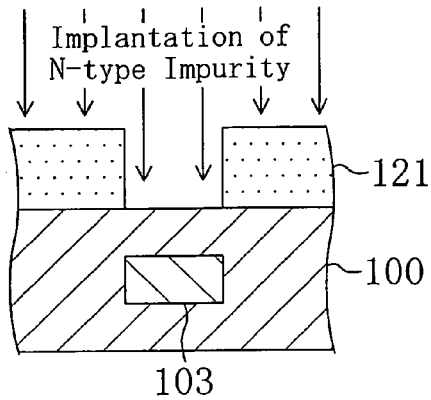
Figure 6C:
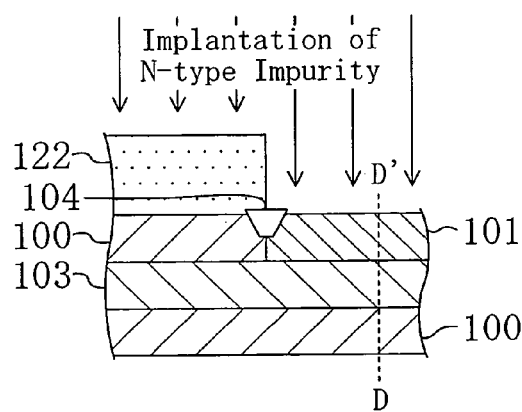
Figure 6D:
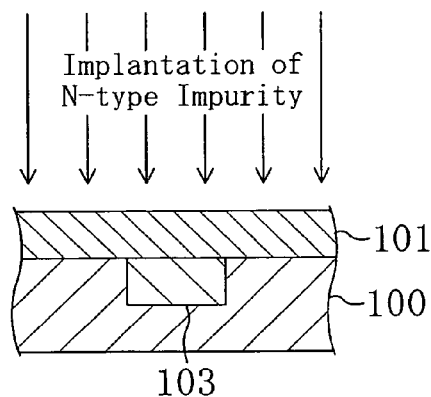
Figure 6E:
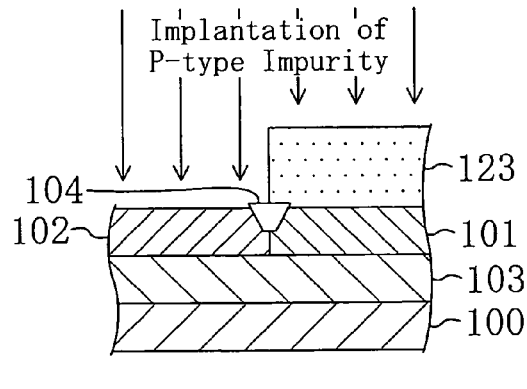
Figure 6F:
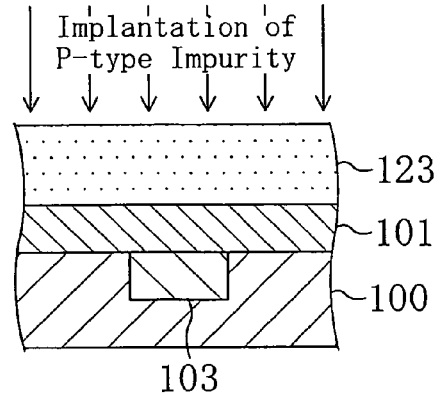

FIGS. 6A to 6F are cross-sectional views illustrating the individual process steps of the method for fabricating the semiconductor device comprising the triple-well structure according to the present embodiment, of which FIGS. 6A, 6C, and 6E show the process in which the cross-sectional structure of the portion along the line A-A' of FIG. 1 is formed and FIGS. 6B, 6D, and 6F show the process in which the cross-sectional structure of the portion along the line X-X' of FIG. 1 is formed.

First, as shown in FIGS. 6A and 6B, a resist film 121 having implant windows formed by selectively opening the regions to be formed with the Deep-N-well regions 103 is formed on the P-type semiconductor substrate 100 provided with the isolations 104 having the STI structure. The implant windows in the resist film 121 intersect the N-well regions 101 to be formed in the subsequent step. Then, by using the resist film 121 as a mask, an N-type impurity is implanted into the P-type semiconductor substrate 100 at an implantation angle (a tilt angle relative to a normal to the principal surface of the substrate) of 0°, whereby the Deep-N-well regions 103 are formed. At this time, to provide electrical connection between the N-well regions 101 to be formed in the subsequent step and the Deep-N-well regions 103, it is necessary to set the peak value of the impurity concentration of each of the Deep-N-well regions 103 to the same level as the peak value of the impurity concentration of each of the N-well regions 101. Specifically, the present embodiment implants phosphorus as an N-type impurity at a dose of $1 \times 10^{13}$ ions/cm$^2$ into the P-type semiconductor substrate 100 with an implant energy of 1 MeV such that the peak of the concentration is formed at a depth in the vicinity of 1 μm from the surface of the P-type semiconductor substrate 100. As a result, the Deep-N-well regions 103 which electrically connect the individual N-well regions 101 to be formed in the subsequent step to each other are formed within the P-type semiconductor substrate 100. It is to be noted that the ion implantation for forming the Deep-N-well regions 103 is performed such that the impurity concentration in the surface of the P-type semiconductor substrate 100 or the impurity concentration in the surface of each of the N-well regions 101 to be formed in the subsequent step does not change.

Figure 7:
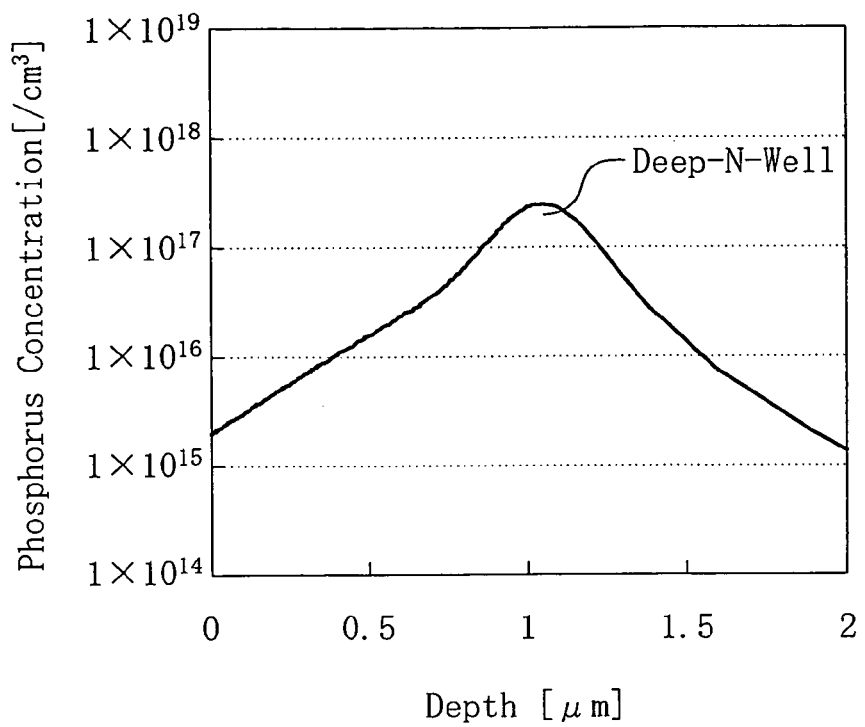
FIG. 7 is a view showing an example of a profile immediately after implantation with phosphorus for forming Deep-N-well regions in the method for fabricating the semiconductor device according to the first embodiment.

FIG. 7 shows an example of a profile (an impurity profile at a cross section along the line C-C' of FIG. 6A) immediately after implantation with the N-type impurity (phosphorus) for forming the Deep-N-well regions 103.

Next, as shown in FIGS. 6C and 6D, a resist film 122 having implant windows formed by selectively opening the regions to be formed with the N-well regions 101 configured as stripes intersecting the Deep-N-Well regions 103 is formed on the P-type semiconductor substrate 100 formed with the Deep-N-well regions 103. Then, by using the resist film 122 as a mask, an N-type impurity is implanted at an implantation angle of 7° into the P-type semiconductor substrate 100, whereby the plurality of N-well regions 101 are formed. At this time, to provide electrical connection between the individual N-well regions 101 via the Deep-N-well regions 103, the ion implantation with the N-type impurity is performed such that the peak value of the impurity concentration of each of the N-well regions 101 becomes equal to the peak value of the impurity concentration of each of the Deep-N-well regions 103. Specifically, the present embodiment implants phosphorus as an N-type impurity at a dose of $1 \times 10^{13}$ ions/cm$^2$ into the P-type semiconductor substrate 100 with an implant energy of 600 keV such that the peak of the concentration is formed at a depth in the vicinity of 0.66 μm from the surface of the P-type semiconductor substrate 100.

Figure 8:
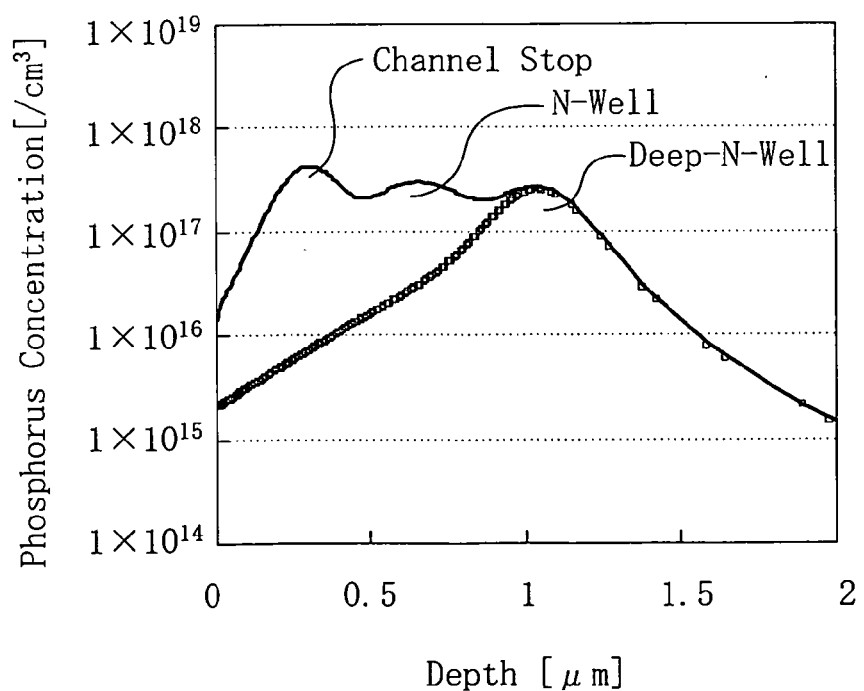
FIG. 8 is a view showing an example of a profile immediately after implantation with phosphorus for forming N-well regions in the method for fabricating the semiconductor device according to the first embodiment.

FIG. 8 shows an example of a profile (an impurity profile at a cross section along the line C-C' of FIG. 6C) immediately after implantation with the N-type impurity (phosphorus) for forming the N-well regions 101. For reference, FIG. 8 also shows the impurity profile of FIG. 7 along with a profile resulting from channel stop implantation which is performed after the N-well implantation. In the channel stop implantation, e.g., boron as a P-type impurity at a dose of $5 \times 10^{12}$ ions/cm$^2$ is implanted at an implantation angle of 7° into the P-type semiconductor substrate 100 with an implant energy of 100 keV such that the peak of the concentration is formed at a depth in the vicinity of 0.32 μm from the surface of the P-type semiconductor substrate 100.

Next, as shown in FIGS. 6E and 6F, a resist film 123 having implant windows formed by selectively opening the regions covered with the resist film 122 during the N-well implantation is formed on the P-type semiconductor substrate 100 formed with the Deep-N-well regions 103 and with the N-well regions 101. In short, the implant windows in the resist film 123 have striped configurations sandwiched between the individual N-well regions 101. Then, by using the resist film 123 as a mask, boron as a P-type impurity at a dose of $5 \times 10^{12}$ ions/cm$^2$ is implanted at an implantation angle of 7° into the P-type semiconductor substrate 100 with an implant energy of 250 keV such that the peak of the concentration is formed at a depth in the vicinity of 0.62 μm from the surface of the P-type semiconductor substrate 100, whereby the plurality of P-well regions 102 are formed.

Thereafter, the N-type MIS transistor 105 and the P-type MIS transistor 106 shown in FIGS. 2 and 3 are formed by implementing the same process as a normal MIS transistor fabrication process on each of the N-well regions 101 and on each of the P-well regions 102, though the depiction thereof is omitted. As a result, the memory cell portion of the SRAM according to the present embodiment is completed.

In the first embodiment, the order in which the steps shown in FIGS. 6A and 6B, the steps shown in FIGS. 6C and 6D, and the steps shown in FIGS. 6E and 6F are performed is not particularly limited.

Figure 9:
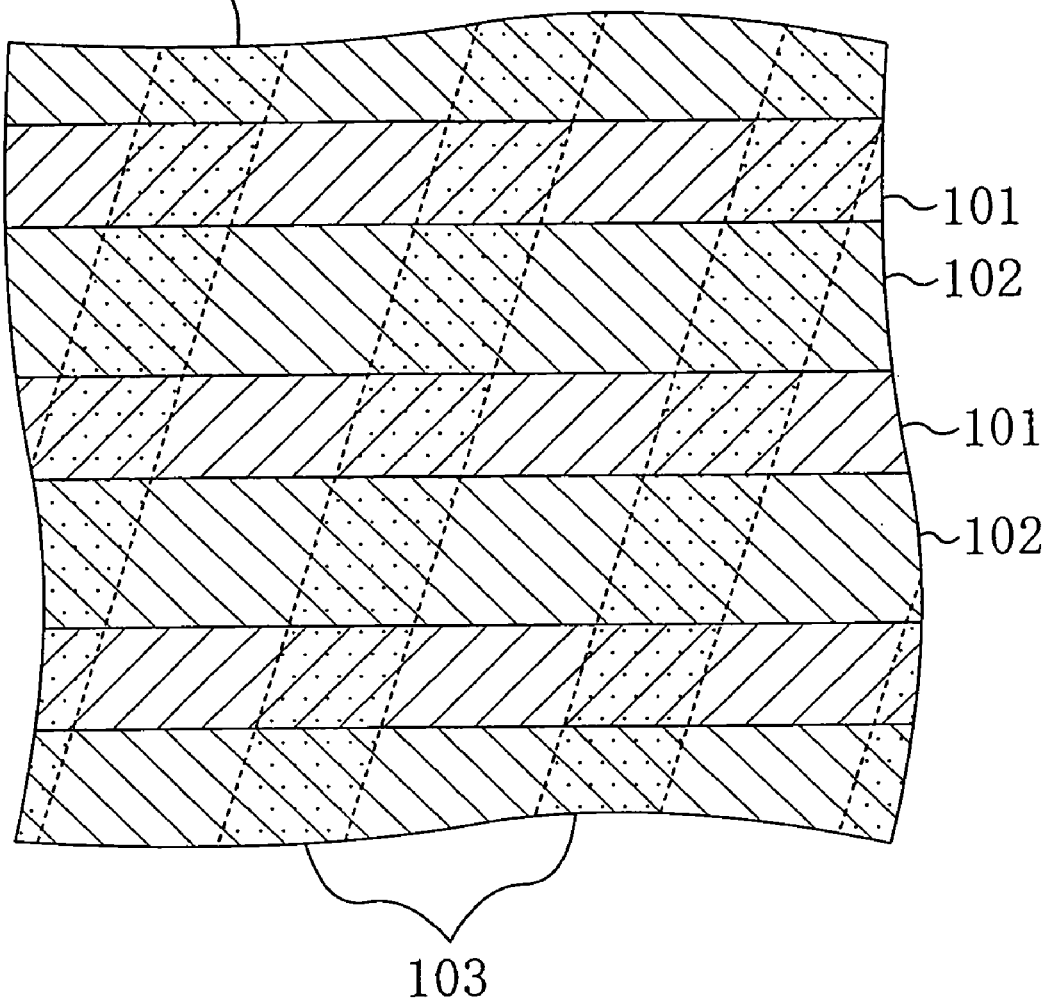
FIG. 9 is a view showing a variation of the plan configuration of the semiconductor device according to the first embodiment.

In the first embodiment, the configuration (plan configuration) of each of the Deep-N-well regions 103 is not particularly limited, either, provided that the individual N-well regions 101 are electrically connected to each other by the Deep-N-well regions 103 and that at least a portion of each of the P-well regions 102 and the P-type semiconductor substrate 100 (more precisely, the region of the P-type semiconductor substrate 100 in which the Deep-N-well region 103 is not formed) are connected to each other. The plan configuration of each of the Deep-N-well regions 103 can be set arbitrarily by changing the pattern of the implant mask. Specifically, as shown in, e.g., FIG. 9 (a variation of the plan configuration of FIG. 1), the plurality of Deep-N-well regions 103 may also be provided to extend in a direction other than orthogonally to the directions in which the N-well regions 101 and the P-well regions 102 extend. The plurality of Deep-N-well regions 103 may also be provided to intersect each other, though the depiction thereof is omitted.

Figure 10:
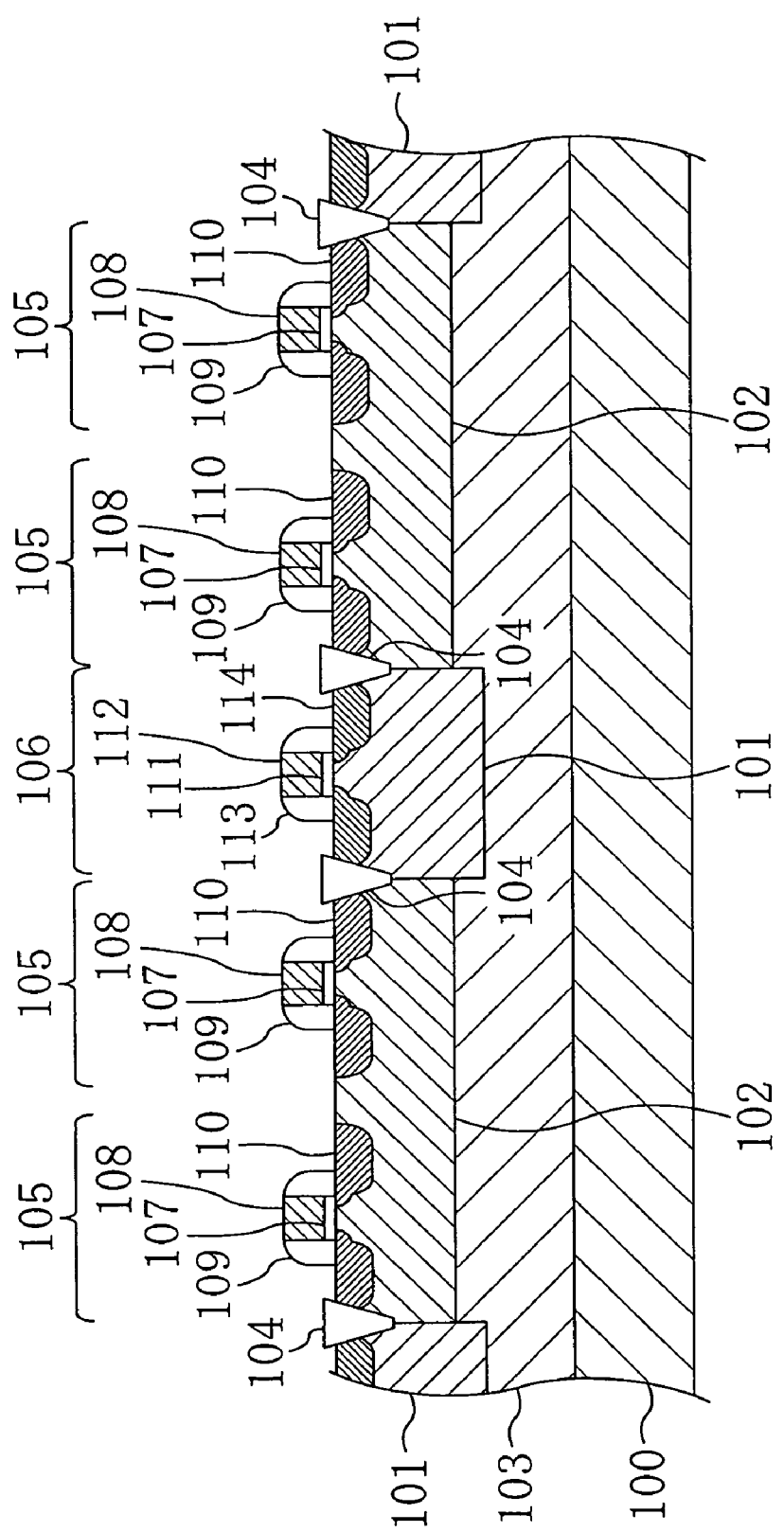
FIG. 10 is a view showing a variation of the cross-sectional configuration of the semiconductor device according to the first embodiment.
Figure 11:
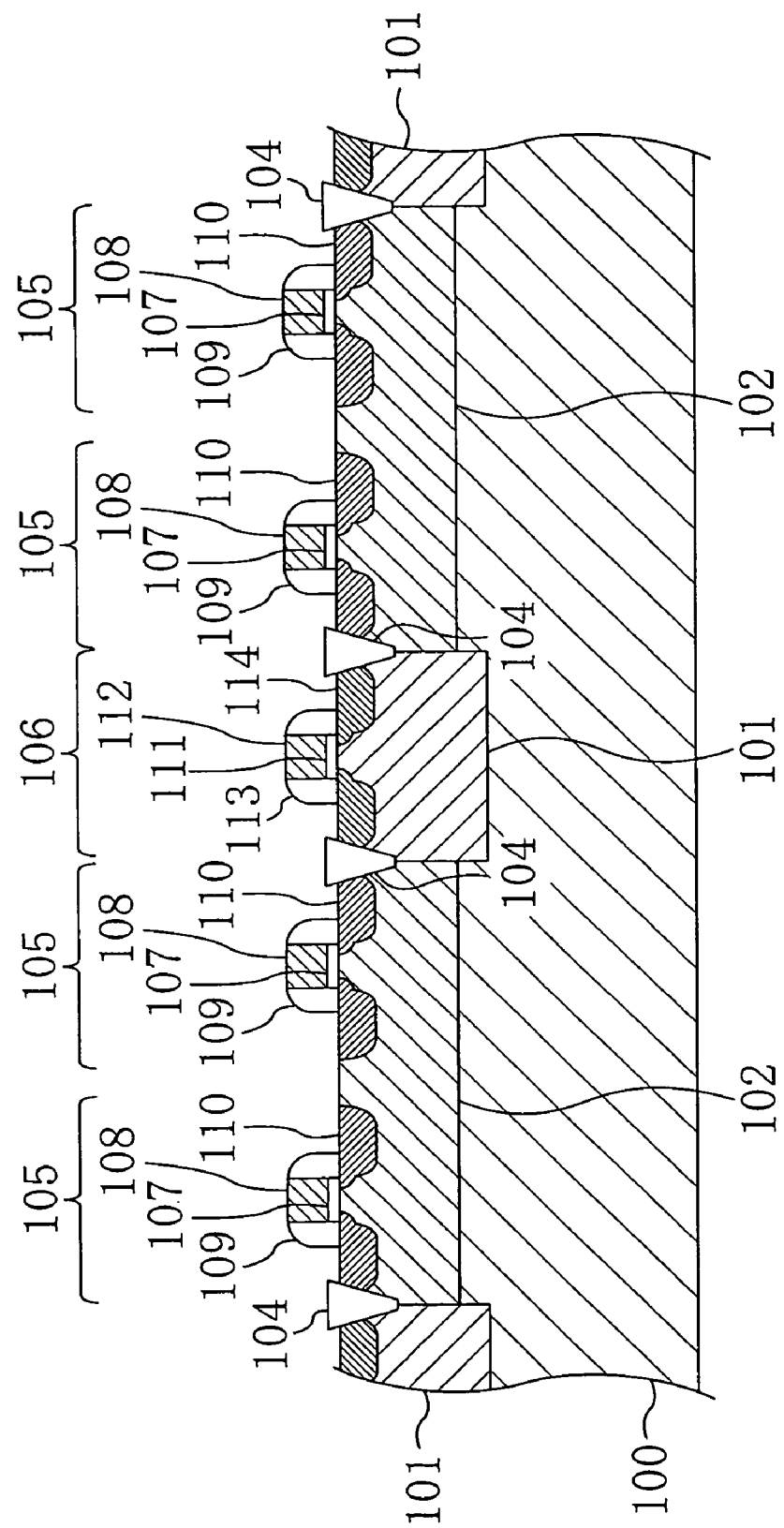
FIG. 11 is a view showing a variation of the cross-sectional configuration of the semiconductor device according to the first embodiment.

In the first embodiment, the positions at which the junctions between the P-well regions 102 and the Deep-N-well regions 103 are formed are not particularly limited, either. Specifically, as shown in, e.g., FIG. 10 (a variation of the cross-sectional structure of FIG. 2) and FIG. 11 (a variation of the cross-sectional structure of FIG. 3), each of the junctions may also be formed under the boundaries between the N-well regions 101 and the Deep-N-well regions 103 or, conversely, over the boundaries therebetween, though the depiction thereof is omitted.

Although the present invention has been applied to the triple-well structure in which the Deep-N-well regions 103 are provided under the N-well regions 101 and the P-well regions 102 provided in the P-type semiconductor substrate 100 in the first embodiment, it may also be applied to a triple-well structure in which Deep-P-well regions are provided under N-well regions and P-well regions provided in an N-type semiconductor substrate.

EMBODIMENT 2

Referring to the drawings, a description will be given herein below to a semiconductor device and a fabrication method therefor according to a second embodiment of the present invention by using the memory cell portion of an SRAM composed of MIS transistors with reference to the drawings.

Figure 12:
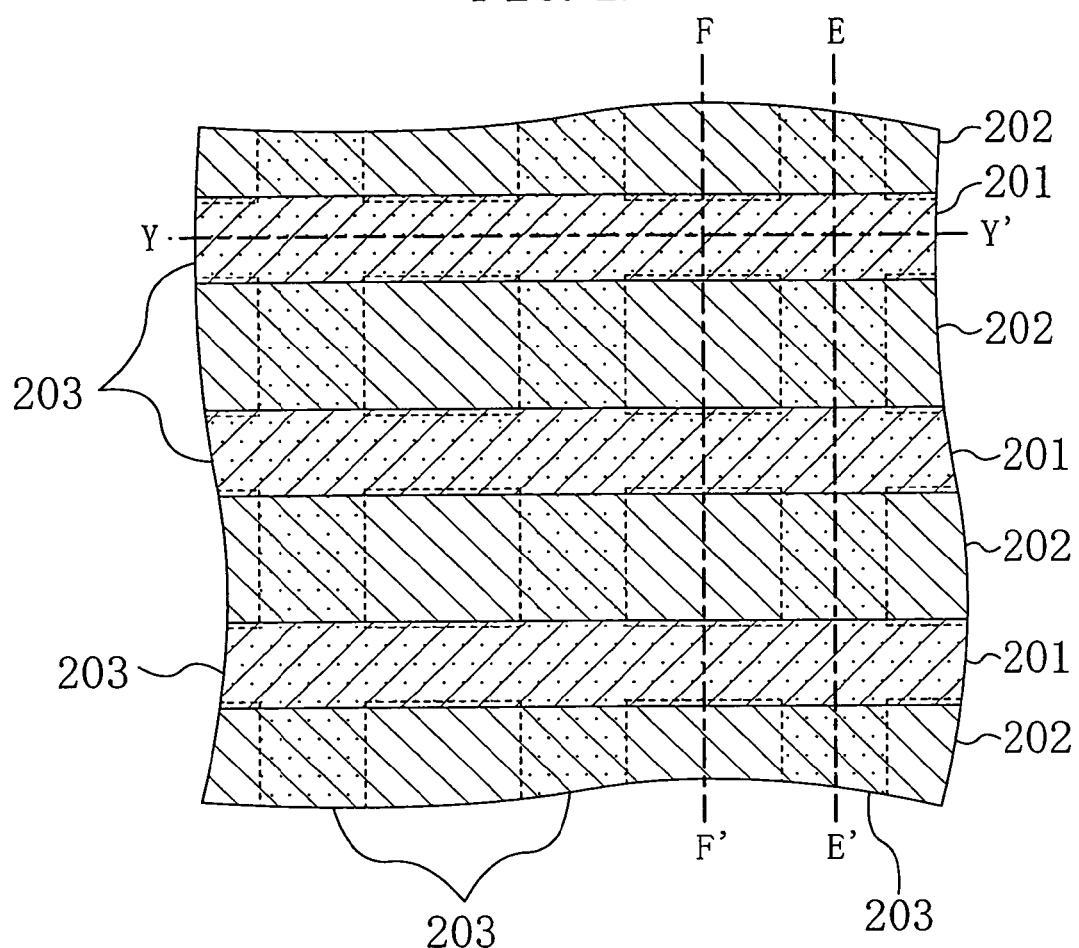
FIG. 12 is a plan view of a semiconductor device according to a second embodiment of the present invention.
Figure 13:
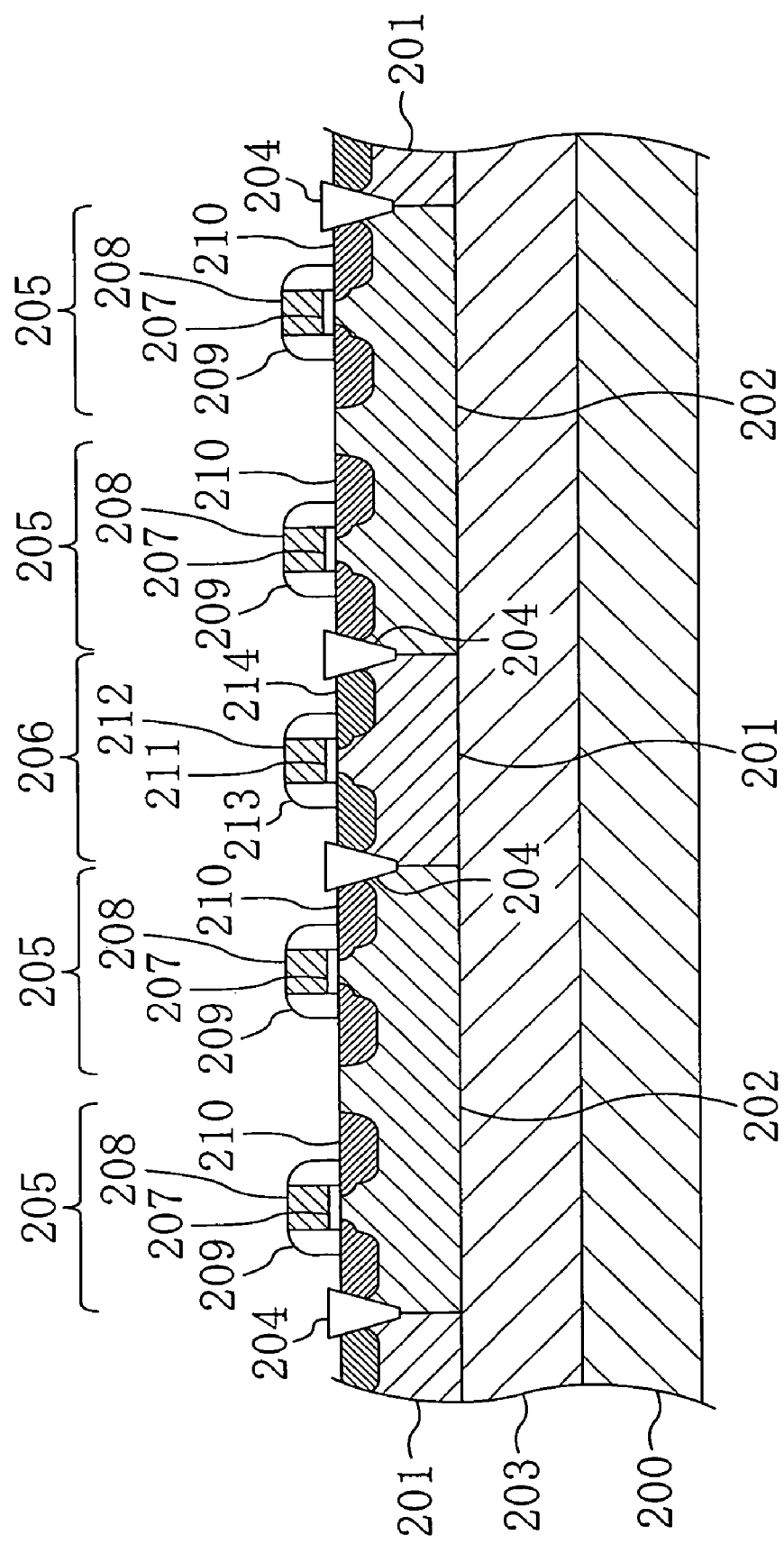
FIG. 13 is a cross-sectional view taken along the line E-E' of FIG. 12.
Figure 14:
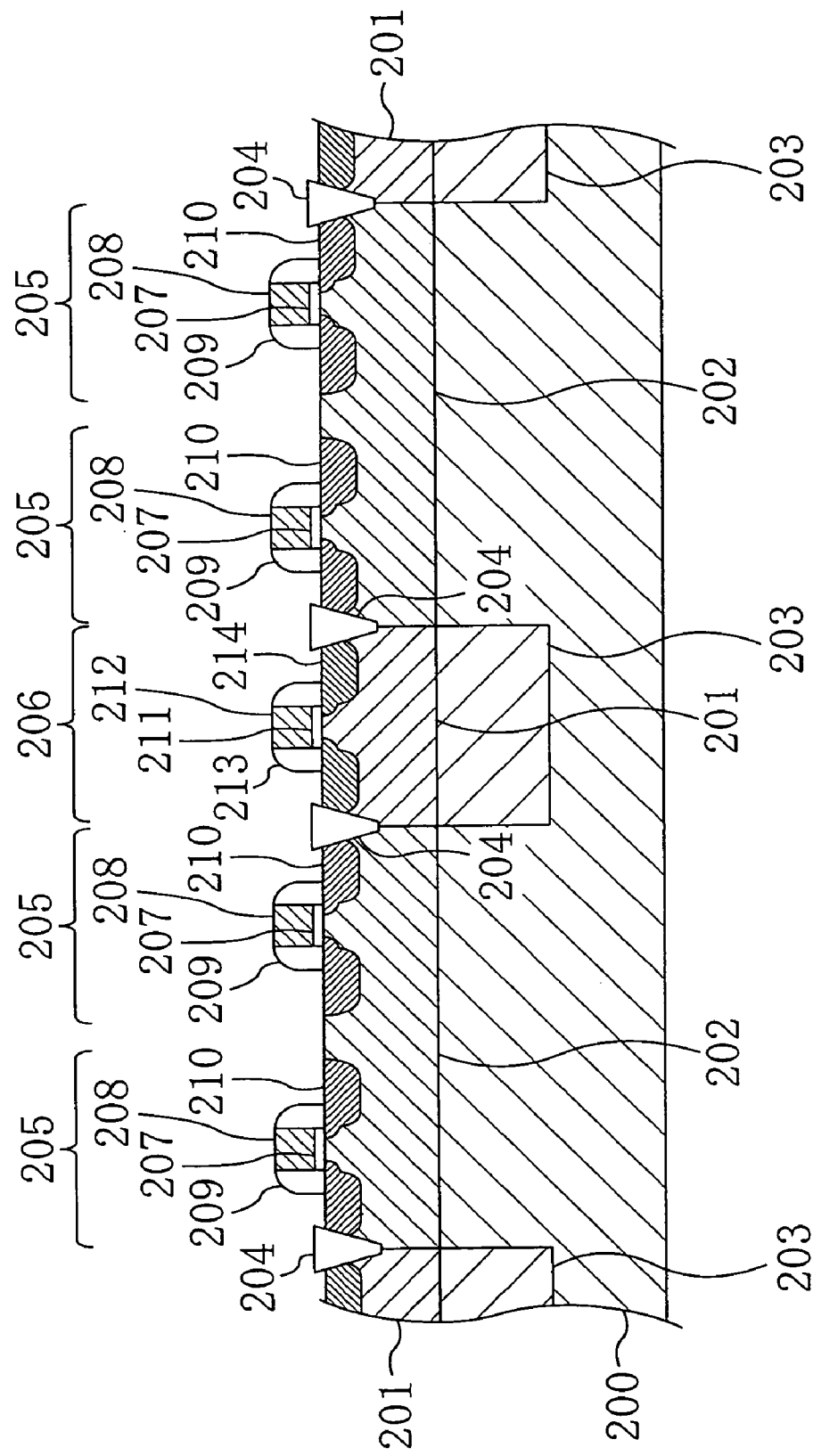
FIG. 14 is a cross-sectional view taken along the line F-F' of FIG. 12.
Figure 15:
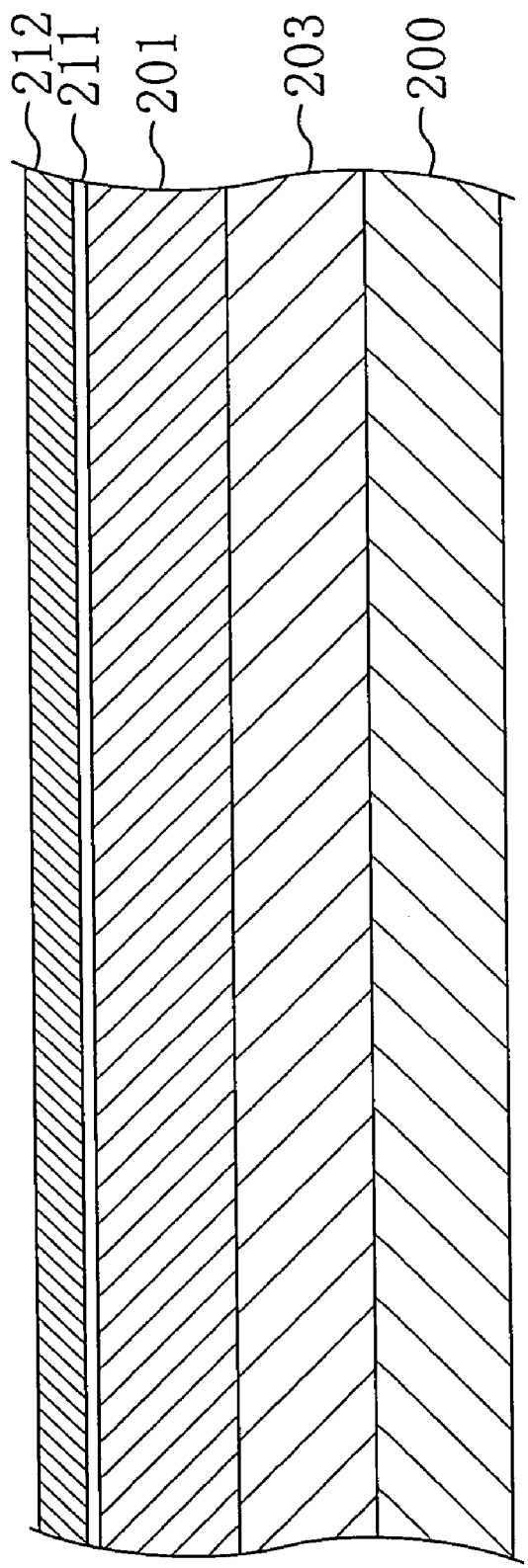
FIG. 15 is a cross-sectional view taken along the line Y-Y' of FIG. 12.

FIG. 12 is a plan view showing an example of the layout of the memory cell portion of the SRAM according to the present embodiment. FIG. 13 is a cross-sectional view taken along the line E-E' of FIG. 12. FIG. 14 is a cross-sectional view taken along the line F-F' of FIG. 12. FIG. 15 is a cross-sectional view taken along the line Y-Y' of FIG. 12.

In FIG. 12, the depiction of transistor structures formed on the individual well regions is omitted.

As shown in FIGS. 12 to 15, a plurality of N-well regions 201 and a plurality of P-well regions 202 are formed to be alternately arranged, each extending from a surface of a P-type semiconductor substrate 200 toward the inside thereof. Between the N-well regions 201 and the P-well regions 202 in the surface portion of the P-type semiconductor substrate 200, there are provided isolations 204 having an STI structure, though they (isolations 204) are not shown in FIG. 12. In addition, a Deep-N-well region 203 having a grid-like plan configuration is formed under the N-well regions 201 and the P-well regions 202 (i.e., a twin-well structure) of the P-type semiconductor substrate 200. The Deep-N-well region 203 is formed at a depth which does not affect the surface concentration of the twin-well structure and has a plurality of first regions which orthogonally intersect the individual N-well regions 201 and the individual P-well regions 202 and a plurality of second regions overlapping the respective N-well regions 201. In short, the plurality of second regions of the Deep-N-well region 203 are formed in parallel relation immediately under the respective N-well regions 201 so that the Deep-N-well region 203 provides electrical connection between the individual N-well regions 201.

The electrical connection between the Deep-N-well region 203 and each of the N-well regions 201 is achieved by setting the peak value of the impurity concentration of each of the Deep-N-well region 203 and the N-well regions 201 at the same level. Specifically, the electrical connection is provided between each of the N-well regions 201 and the Deep-N-well region 203 by performing ion implantation for forming the deep-N-well region 203 such that the peak of the impurity concentration of the Deep-N-well region 203 is formed at a position slightly deeper than the peak level in the implant profile of each of the N-well regions 201.

As also shown in FIGS. 12 to 15, an N-type MIS transistor (e.g., an NMOS transistor) 205 is formed on each of the P-well regions 202 and a P-type MIS transistor (e.g., a PMOS transistor) 206 is formed on each of the N-well regions 201. Specifically, the N-type MIS transistor 205 is composed of: a gate oxide film 207 formed on the P-well region 202; a gate electrode 208 formed on the gate oxide film 207; insulating sidewalls 209 formed on the side surfaces of the gate electrode 208; and N-type source/drain regions 210 formed in the surface portion of the P-well region 202. On the other hand, the P-type MIS transistor 206 is composed of: a gate oxide film 211 formed on the N-well region 201; a gate electrode 212 formed on the gate oxide film 211; insulating sidewalls 213 formed on the side surfaces of the gate electrode 212; and P-type source/drain regions 214 formed in the surface portion of the N-well region 201.

Similarly to the triple-well structure according to the first embodiment, the triple-well structure according to the present embodiment is characterized in that, unlike the conventional triple-well structure in which the Deep-N-well region 13 is provided in the entire region under the twin-well structure composed of the N-well regions 11 and the P-well regions 12, the first regions of the Deep-N-well region 203 are provided along directions perpendicular to the directions in which the N-well regions 201 and the P-well regions 202 in the twin-well structure extend and the second regions of the Deep-N-well region 203 are provided to overlap the individual N-well regions 201. In each of the regions shown in FIG. 14, each of the P-well regions 202 is partly connected electrically to the P-type semiconductor substrate 200 (more precisely, the region of the P-type semiconductor substrate 200 in which the Deep-N-well region 203 is not formed). That is, since the region in which the Deep-N-well region 203 is not provided remains under each of the P-well regions 202, the connection between each of the P-well regions 202 and the P-type semiconductor substrate 200 is retained to allow the P-well region 202 and the P-type semiconductor substrate 200 to be electrically connected to each other without providing the P-well region 202 with a contact area for providing a substrate potential.

Thus, the important characteristic of the present invention is that the region in which the Deep-N-well region 203 is not provided is left under each of the P-well regions 202. The characteristic allows the triple-well structure to achieve an intrinsic effect, i.e., the effect of reducing N-well resistance and thereby increasing latch-up breakdown voltage, while suppressing an increase in P-well resistance. In addition, since the substrate potential can be shared among the individual P-well regions 202, the contact area for providing the surface of each of the P-well regions 202 with the substrate potential can be reduced so that the effect of suppressing the area occupied by an arrangement of memory cells is also achievable.

In addition, since the present embodiment has formed the Deep-N-well region 203 (more precisely the second regions thereof) immediately under the individual N-well regions 201, the N-well resistance is further reduced than in the first embodiment. As a result, a surge current that has flown from the input/output portion (not shown) of the SRAM not only follows the path (see FIG. 5) followed by the surge current in the first embodiment but also is more likely to be distributed even in the direction in which each of the N-well regions 201 extends. Because the surge current can thus be distributed more efficiently, it becomes possible to prevent the localization of the surge current to one of the N-well regions 201 as a portion into which the surge current has flown and to the device formed therein and thereby increase the latch-up breakdown voltage more effectively.

A description will be given herein below to a method for fabricating the semiconductor device comprising the triple-well structure according to the present embodiment shown in FIGS. 12 to 15.

Figure 16A:
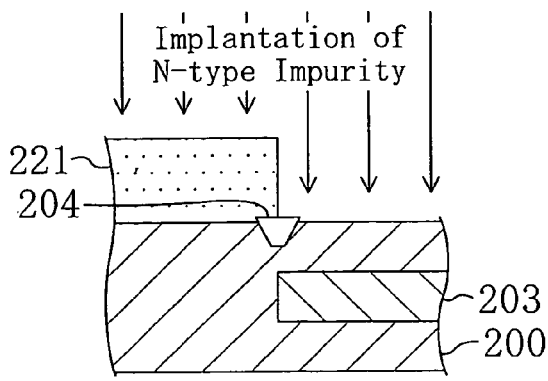
FIGS. 16A to 16F are cross-sectional views illustrating the individual process steps of a method for fabricating the semiconductor device according to the second embodiment.
Figure 16B:
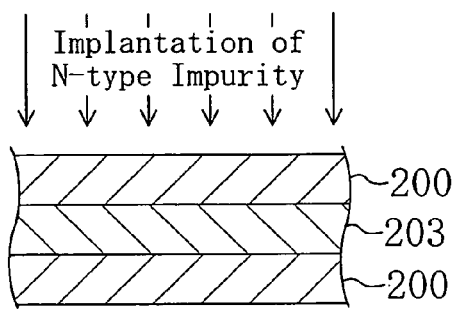
Figure 16C:
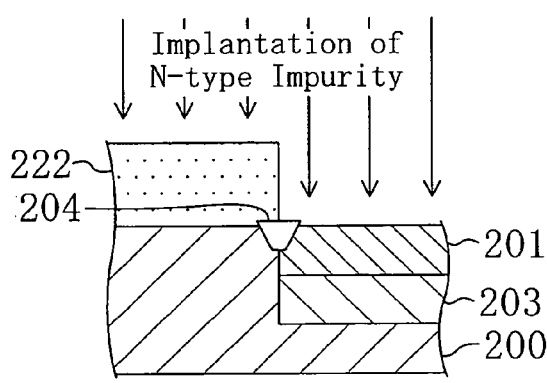
Figure 16D:
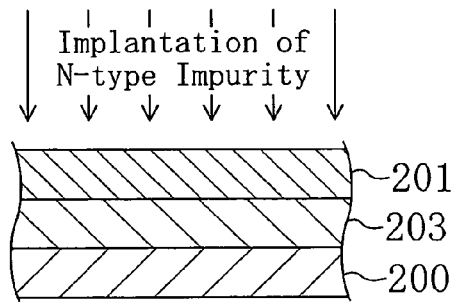
Figure 16E:
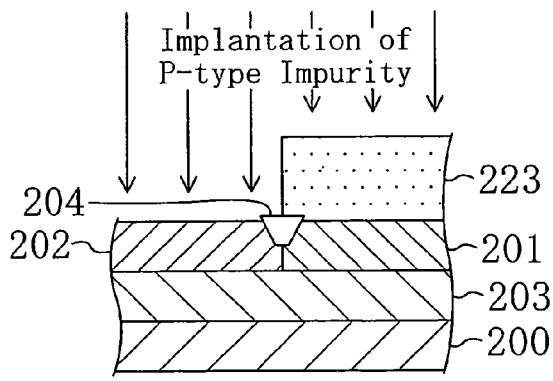
Figure 16F:
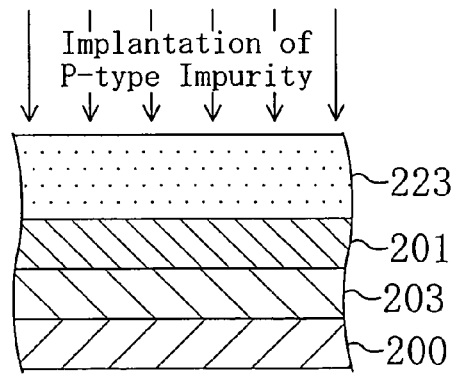
Figure 17:
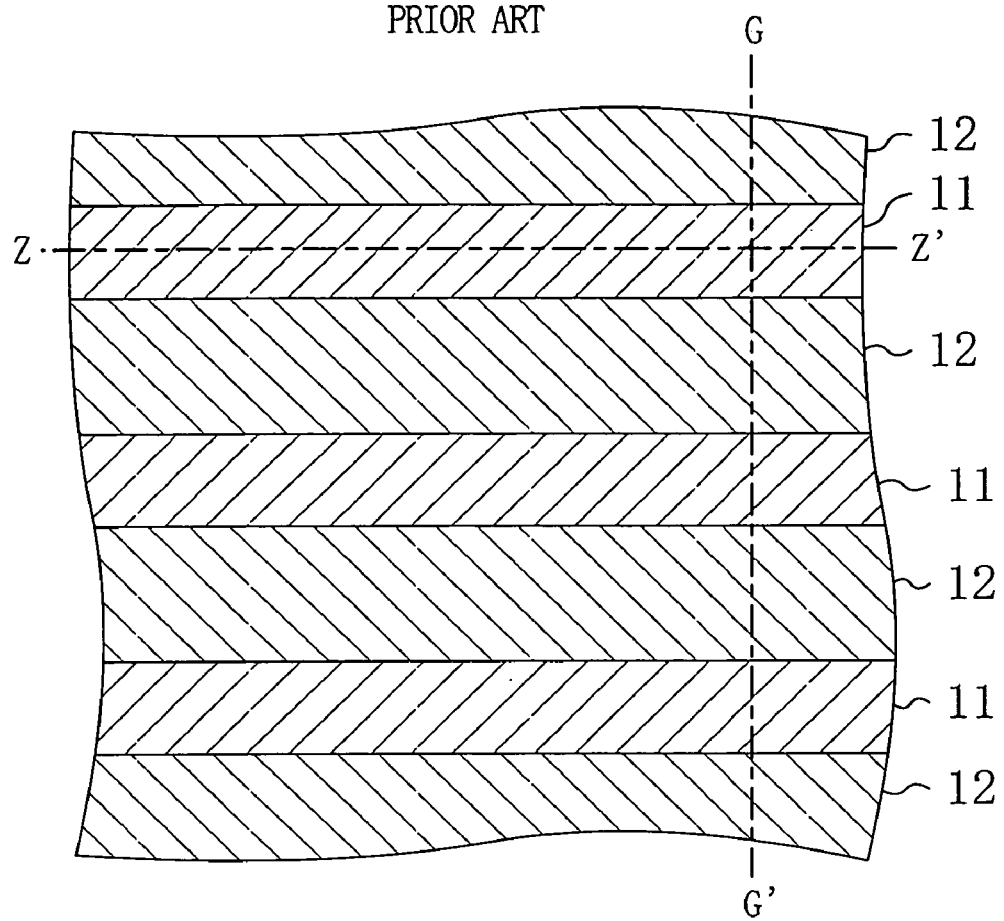
FIG. 17 is a plan view showing an example of the layout of a conventional memory cell portion.
Figure 18:
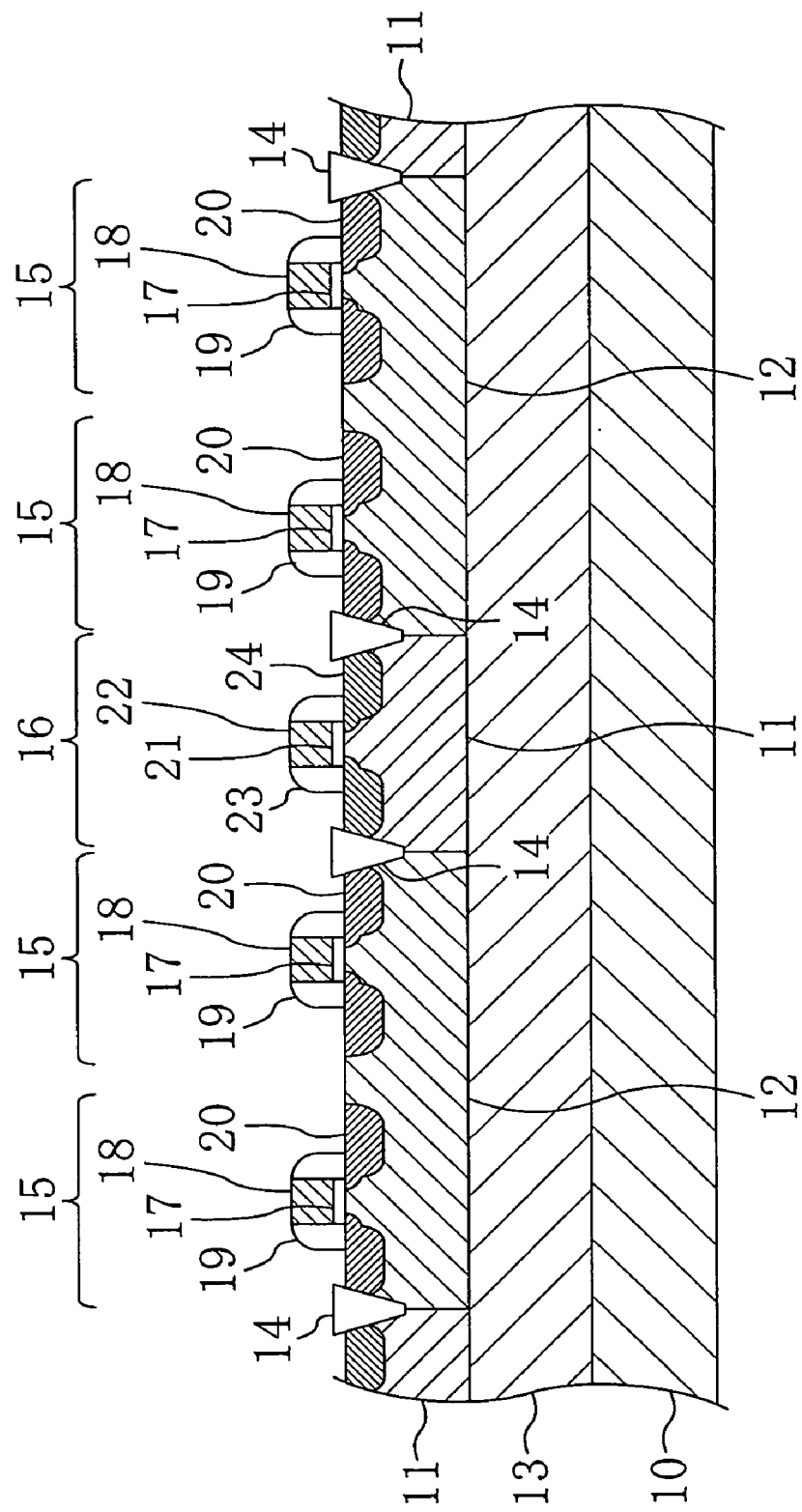
FIG. 18 is a cross-sectional view taken along the line G-G' of FIG. 17.
Figure 19:
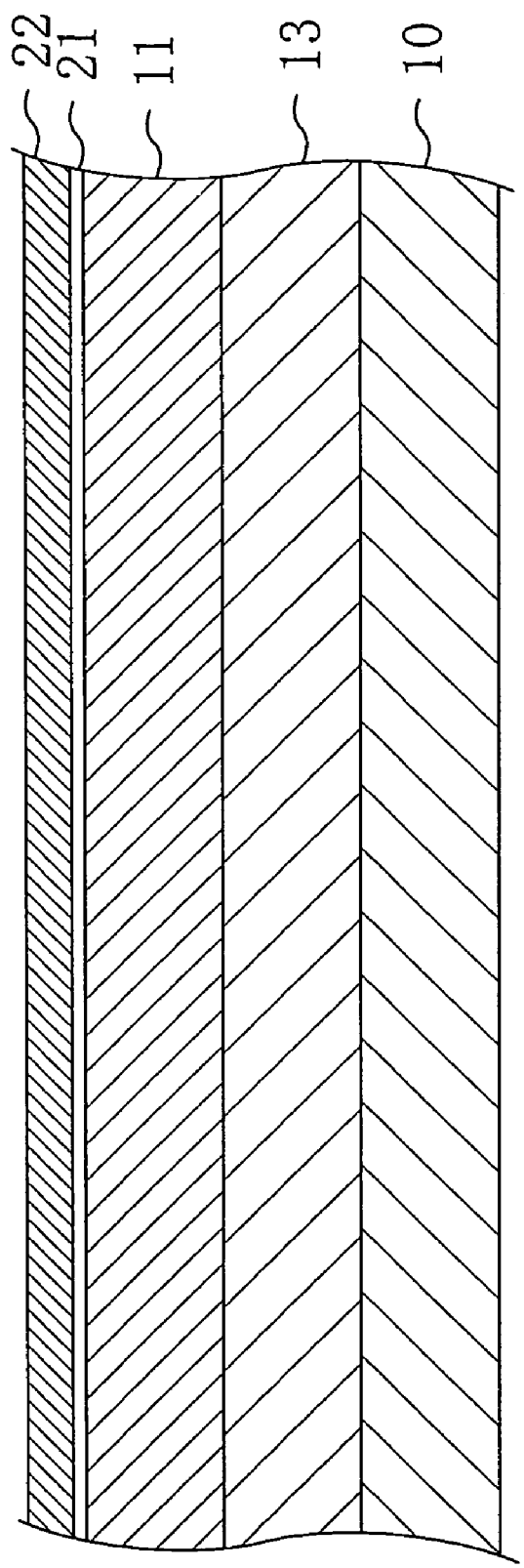
FIG. 19 is a cross-sectional view taken along the line Z-Z' of FIG. 17.

FIGS. 16A to 16F are cross-sectional views illustrating the individual process steps of the method for fabricating the semiconductor device comprising the triple-well structure according to the present embodiment, of which FIGS. 16A, 16C, and 16E show the process in which the cross-sectional structure of the portion along the line E-E' of FIG. 12 is formed and FIGS. 16B, 16D, and 16F show the process in which the cross-sectional structure of the portion along the line Y-Y' of FIG. 12 is formed.

First, as shown in FIGS. 16A and 16B, a resist film 221 having an implant window formed by selectively opening the region to be formed with the Deep-N-well region 203 having the grid-like plan configuration is formed on the P-type semiconductor substrate 200 provided with the isolations 204 having the STI structure. In contrast to the first embodiment which has formed the resist film 121 by selectively opening therein the implant windows having striped configurations intersecting the individual well regions 101, the present embodiment forms the resist film 221 by selectively opening therein the implant window having a plurality of second regions configured as stripes overlapping the individual N-well regions 201 in addition to a plurality of first regions configured as stripes intersecting the individual N-well regions 201. Then, by using the resist film 221 as a mask, an N-type impurity is implanted into the P-type semiconductor substrate 200 at an implantation angle of 0°, whereby the Deep-N-well region 203 is formed. At this time, to provide electrical connection between the N-well regions 201 to be formed in the subsequent step and the Deep-N-well region 203, it is necessary to set the peak value of the impurity concentration of the Deep-N-well region 203 to the same level of the impurity concentration of each of the N-well regions 201. Specifically, the present embodiment implants phosphorus as an N-type impurity at a dose of $1 \times 10^{13}$ ions/cm$^2$ into the P-type semiconductor substrate 200 with an implant energy of 1 MeV such that the peak of the concentration is formed at a depth in the vicinity of 1 μm from the surface of the P-type semiconductor substrate 200, similarly to the first embodiment. As a result, the Deep-N-well region 203 which electrically connects the N-well regions 201 to be formed in the subsequent step to each other is formed within the P-type semiconductor substrate 200. It is to be noted that the ion implantation for forming the Deep-N-well region 203 is performed such that the impurity concentration in the surface of the P-type semiconductor substrate 200 or the impurity concentration in the surface of each of the N-well regions 201 to be formed in the subsequent step does not change.

Next, as shown in FIGS. 16C and 16D, a resist film 222 having an implant window opened therein to have first striped configurations intersecting the first regions of the Deep-N-Well region 203 having the grid-like plan configuration and second striped configurations overlapping the second regions of the Deep-N-well region 203 is formed on the P-type semiconductor substrate 200 formed with the Deep-N-well region 203. Then, by using the resist film 222 as a mask, an N-type impurity is implanted at an implantation angle of 7° into the P-type semiconductor substrate 200, whereby the plurality of N-well regions 201 are formed. At this time, to provide electrical connection between the individual N-well regions 201 via the Deep-N-well region 203, the ion implantation with the N-type impurity is performed such that the peak value of the impurity concentration of each of the N-well regions 201 becomes equal to the peak value of the impurity concentration of the Deep-N-well region 203. Specifically, the present embodiment implants phosphorus as an N-type impurity at a dose of $1\times10^{13}$ ions/cm$^2$ into the P-type semiconductor substrate 200 with an implant energy of 600 keV such that the peak of the concentration is formed at a depth in the vicinity of 0.66 µm from the surface of the P-type semiconductor substrate 200.

In the present embodiment also, channel stop implantation may be performed appropriately after the N-well implantation. In the channel stop implantation, e.g., boron as a P-type impurity at a dose of $5\times10^{12}$ ions/cm$^2$ is implanted at an implantation angle of 7° into the P-type semiconductor substrate 200 with an implant energy of 100 keV such that the peak of the concentration is formed at a depth in the vicinity of 0.32 µm from the surface of the P-type semiconductor substrate 200.

Next, as shown in FIGS. 16E and 16F, a resist film 223 having implant windows formed by selectively opening the regions covered with the resist film 222 during the N-well implantation is formed on the P-type semiconductor substrate 200 formed with the Deep-N-well region 203 and with the N-well regions 201. In short, the implant windows in the resist film 223 have striped configurations sandwiched between the individual N-well regions 201. Then, by using the resist film 223 as a mask, boron as a P-type impurity at a dose of $5\times10^{12}$ ions/cm$^2$ is implanted at an implantation angle of 7° into the P-type semiconductor substrate 200 with an implant energy of 250 keV such that the peak of the concentration is formed at a depth in the vicinity of 0.62 µm from the surface of the P-type semiconductor substrate 200, whereby the plurality of P-well regions 202 are formed.

Thereafter, the N-type MIS transistor 205 and the P-type MIS transistor 206 shown in FIGS. 13 and 14 are formed by implementing the same process as a normal MIS transistor fabrication process on each of the N-well regions 201 and each of the P-well region 202, though the depiction thereof is omitted. As a result, the memory cell portion of the SRAM according to the present embodiment is completed.

In the second embodiment, the order in which the steps shown in FIGS. 16A and 16B, the steps shown in FIGS. 16C and 16D, and the steps shown in FIGS. 16E and 16F are performed is not particularly limited.

In the second embodiment, the configuration (plan configuration) of the Deep-N-well region 203 is not particularly limited, either, provided that the individual N-well regions 201 are electrically connected to each other by the Deep-N-well region 203, while the Deep-N-well region 203 overlaps at least one of the N-well regions 201, and that at least a portion of each of the P-well regions 202 and the P-type semiconductor substrate 200 (more precisely, the region of the P-type semiconductor substrate 200 in which the Deep-N-well region 203 is not formed) are connected to each other. The plan configuration of the Deep-N-well region 203 can be set arbitrarily by changing the pattern of the implant mask. Specifically, for example, each of the first regions of the Deep-N-well region 203 may also be provided to extend in a direction other than orthogonally to the directions in which the N-well regions 201 and the P-well regions 202 extend. Alternatively, the individual first regions of the Deep-N-well region 203 may also be provided to intersect each other. There may also be the N-well region 201 which does not overlap any of the second regions of the Deep-N-well region 203.

In the second embodiment, the positions at which the junctions between the P-well regions 202 and the Deep-N-well region 203 are formed are not particularly limited, either. Specifically, each of the junctions may also be formed under the boundaries between the N-well regions 201 and the Deep-N-well region 203 or, conversely, over the boundaries therebetween.

Although the present invention has been applied to the triple-well structure in which the Deep-N-well region 203 is provided under the N-well regions 201 and the P-well regions 202 provided in the P-type semiconductor substrate 200 in the second embodiment, it may also be applied to a triple-well structure in which a Deep-P-well region is provided under N-well regions and P-well regions provided in an N-type semiconductor substrate.

What is claimed is:

1. A semiconductor device comprising:
   a semiconductor substrate of a first conductivity type;
   a first well region of the first conductivity type which is formed to extend from a surface of the semiconductor substrate toward an inside thereof;
   a pair of second well regions as of a second conductivity type which are formed to extend from the surface of the semiconductor substrate toward the inside thereof in such a manner as to sandwich the first well region therebetween; and
   a third well region of the second conductivity type which is formed under each of the first well region and the pair of second well regions in the semiconductor substrate, wherein
   the third well region intersects the first well region and the pair of second well regions at right angles with respect to a direction along which each of the first well region and the pair of second well regions extends.
   the third well region electrically connects the pair of second well regions to each other and
   the first well region is partially connected to a region of the semiconductor substrate in which he third well region is not formed.

2. The semiconductor device of claim 1, wherein the third well region is formed in a region under at least one of the pair of second well regions in a direction along which the at least one of the pair of second well regions extends.

3. A method for fabricating the semiconductor device as recited in claim 2, the method comprising the steps of:
   forming, on the semiconductor substrate, a resist film having an implant window opened therein to have a first region intersecting each of the pair of second well regions and a second region overlapping at least one of the pair of second well regions and ion-implanting an impurity of the second conductivity into the semiconductor substrate by using the resist fin as a mask such that a surface concentration of the semiconductor substrate or a surface concentration of the first well region does not change to form the third well region;

forming, on the semiconductor substrate, a resist film having an implant window opened therein to have a first striped configuration intersecting the first region of the third well region and a second striped configuration overlapping the second region of the third well region and then ion-implanting an impurity of the second conductivity type into the semiconductor substrate by using the resist film as a mask to form the pair of second well regions such tat the pair of second well regions are connected electrically to each other via the third well region and that a peak value of an impurity concentration of each of the pair of second well regions is equal to a peak value of an impurity concentration of the third well region; and forming, on the semiconductor substrate, a resist film having an implant window opened therein to have a striped configuration sandwiched between the pair of second well regions and then ion-implanting an impurity of the first conductivity type into the semiconductor substrate by using the resist film as a mask to form the first well region.

4. The semiconductor device of claim 2, wherein each of the first well region and the pair of second well regions has a striped configuration and the third well region has a grid-like plan configuration.

5. The semiconductor device of claim 1, wherein the first well region, the pair of second well regions, and the third well region constitute a memory cell portion of an SRAM.

6. A method for fabricating the semiconductor device as recited in claim 1, die method comprising the steps of:

forming, on the semiconductor substrate, a resist film having an implant window opened therein to intersect each of the pair of second well regions and then ion-implanting an impurity of the second conductivity type into the semiconductor substrate by using the resist as a mask such that a surface concentration of the semiconductor substrate or a surface concentration of the first well region does not change to form the third well region;

forming, on the semiconductor substrate, a resist film having implant windows each opened therein to have a striped configuration intersecting the third well region and then ion-implanting an impurity of the second conductivity type into the semiconductor substrate by using the resist film as a mask to form the pair of second well regions such that the pair of second well regions are connected electrically in each other via the third well region and that a peak value of an impurity concentration of each of the pair of second well regions becomes equal to a peak value of an impurity concentration of the third well region; and forming, on the semiconductor substrate, a resist film having an implant window opened therein to have a striped configuration sandwiched between the pair of second regions and then ion-implanting an impurity of the first conductivity into the semiconductor substrate by using the resist film as a mask to form the first well region.

7. The semiconductor device of claim 1, wherein each of the first well region, the pair of second well regions and the third well region has a striped configuration.

8. The semiconductor device of claim 1, wherein each of the first well region and the pair of second well regions has a striped configuration and the third well region has a grid-like plan configuration.

9. The semiconductor device of claim 1, wherein isolation regions having an STI structure are formed between the first well region and each of the pair of second well regions in the surface of the semiconductor substrate.

10. The semiconductor device of claim 1, wherein a peak of an impurity concentration of the third well region is formed at a position deeper than a peak of an impurity concentration of each of the pair of second well regions.

11. The semiconductor device of claim 1, wherein the first conductivity type is a P-type, and
the second conductivity type is an N-type.

12. The semiconductor device of claim 1, wherein an N-type MIS transistor is formed on the first well region, and
a P-type MIS transistor is formed on each of the pair of second well regions.

13. The semiconductor device of claim 1, wherein the third well region extends in a direction perpendicular to the direction along which each of the first well region and the pair of second well regions extends.

14. The semiconductor device of claim 1, wherein the first well region and the semiconductor substrate are electrically connected to each other.

* * * * *